United States Patent [19]
Morgan

[11] Patent Number: 6,083,271
[45] Date of Patent: Jul. 4, 2000

[54] METHOD AND APPARATUS FOR SPECIFYING MULTIPLE POWER DOMAINS IN ELECTRONIC CIRCUIT DESIGNS

[75] Inventor: David Allen Morgan, Fort Collins, Colo.

[73] Assignee: LSI Logic Corporation, Milpitas, Calif.

[21] Appl. No.: 09/072,566

[22] Filed: May 5, 1998

[51] Int. Cl.[7] ................................................. G06F 17/50
[52] U.S. Cl. .................................................. 716/1; 716/9
[58] Field of Search ........................ 395/500.02, 500.05, 395/500.06, 500.08, 500.2; 364/488, 489, 490, 491; 716/1, 2, 7, 8, 9, 13

[56] References Cited

U.S. PATENT DOCUMENTS

| | | | |
|---|---|---|---|
| 4,612,618 | 9/1986 | Pryor et al. | 364/490 |
| 4,638,442 | 1/1987 | Bryant et al. | 395/500.15 |
| 4,731,643 | 3/1988 | Dunham et al. | 357/68 |
| 5,047,949 | 9/1991 | Yamaguchi et al. | 364/491 |
| 5,313,079 | 5/1994 | Brasen et al. | 257/206 |
| 5,349,542 | 9/1994 | Brasen et al. | 364/578 |
| 5,378,904 | 1/1995 | Suzuki et al. | 395/500.02 |
| 5,418,733 | 5/1995 | Kamijima | 364/490 |
| 5,483,461 | 1/1996 | Lee et al. | 395/500.15 |
| 5,502,649 | 3/1996 | Hirata | 364/490 |
| 5,537,328 | 7/1996 | Ito | 364/489 |
| 5,541,849 | 7/1996 | Rostoker et al. | 395/500.04 |
| 5,689,432 | 11/1997 | Blaauw et al. | 395/500.19 |
| 5,870,308 | 2/1999 | Dangelo et al. | 395/500.02 |

OTHER PUBLICATIONS

Mehranfer "STAT: A Schematic to Artwork Translator for Custom Analog Cells," Proceedings of the IEEE 1990 Custom integrated Circuits Conference, May 13–16, 1990, p.30.2/1–30.2/4.

Mitsuhashi and Kuh "Power and Ground Network Topology Optimization for Cell Based VLSIs," 29th ACM/IEEE Design Automation Conference, Jun. 8–12, 1992, p.524–529.

Stanisic et al. "Power Distribution Synthesis for Analog and Mixed–Signal ASICs in RAIL," Proceedings of the IEEE 1993 Custom Integrated Circuits Conference, May 9–12, 1993, p.17.4.1–17.4.5.

Stanisic et al. "Mixed–Signal Noise–Decoupling Via Simultaneous Power Distribution Design and Cell Customization in RAIL," Proceedings of the IEEE 1994 Custom Integrated Circuits Conference, May 1–4, 1994, p.533–536.

Farbarik et al. "CAD Tools for Area–Distributed I/O Pad Packaging," 1997 IEEE Multi–Chip Module Conference, Feb. 4–5, 1997, p.125–129.

Dalal et al. "Design of an Efficient Power Distribution Network for the UltraSPARC–I Microprocessor," Proceedings of the 1995 IEEE International Conference on Computer Design: VSLI in Computers and Processors, Oct. 2–4, 1995, p.118–123

*Primary Examiner*—Paul R. Lintz
*Assistant Examiner*—Leigh Marie Garbowski

[57] ABSTRACT

Methods and apparatus for use with electronic circuit design tools to define and test multiple power and ground domains within an electronic circuit design. The present invention defines a power and ground specification associated with a CAD/CAE tools design database. To build the power and ground specification, first, power and ground domains are defined and the circuit design is partitioned into one or more groups of devices which correspond to the power and ground domains. Second, power and ground signals are associated with these defined groups of devices. Lastly, this information is stored within a power and ground specification integrated with the information within the design database to allow the CAD/CAE tools to test the multiple power and ground domains within the IC or circuit board design.

25 Claims, 7 Drawing Sheets

FIG. 3

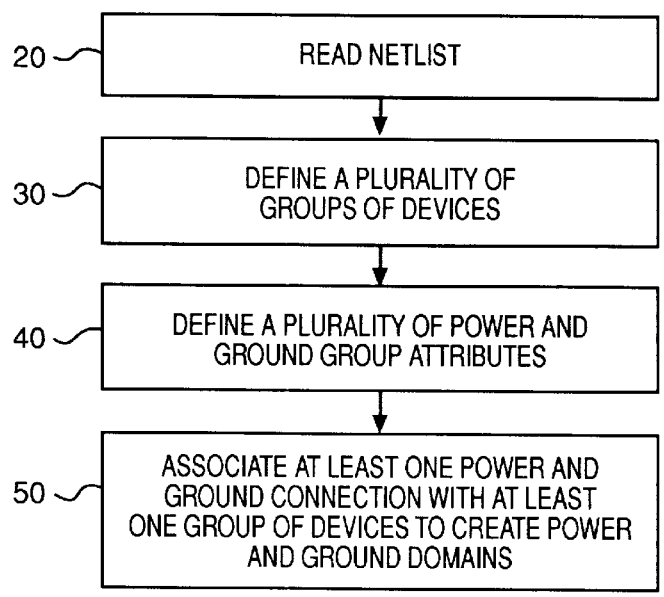

- 20 — READ NETLIST
- 30 — DEFINE A PLURALITY OF GROUPS OF DEVICES
- 40 — DEFINE A PLURALITY OF POWER AND GROUND GROUP ATTRIBUTES
- 50 — ASSOCIATE AT LEAST ONE POWER AND GROUND CONNECTION WITH AT LEAST ONE GROUP OF DEVICES TO CREATE POWER AND GROUND DOMAINS

FIG. 3A

| GROUP NAME | GROUP ELEMENTS INSTANCE / CELL TYPE |
|---|---|
| G1 | U1 (AND), U2 (AND) |
| G2 | U3 (RAM) |
| G3 | U4 (CPU) |
| G4 | U5 (INPAD), U6 (OUTPAD), U7 (INPAD), U8 (POWER PAD), U9 (GROUND PAD) |
| G5 | U10 (INPAD), U11 (OUTPAD), U12 (ANALOG POWER PAD), U13 (ANALOG GROUND PAD) |
| G6 | U14 (RAM) |
| DMA | U15 (DMA), U16 (DMA), U17 (DMA), |
| DEFAULT | U18 (AND), U19 (OR), U20 (NAND) |

FIG. 3B

| GROUP NAME | GROUP ATTRIBUTE NAME | VALUE(S) |
|---|---|---|
| G1 | PG_BUS | VSS, VDD |
| G2 | PG_BUS | VSS, VDD, VSS2, VDD2 |
| G3 | PG_BUS | CPVSS, C[VDD |
| G4 | PG_BUS | VSS, VDD, VSS2, VDD2 |
| G5 | PG_BUS | VSSA, VDDA |
| G1 | USER 1 | DIGITAL |
| G2 | USER 1 | DIGITAL |
| G5 | USER 1 | ANALOG |
| DMA | PG_BUS | VSS3, VDD3 |
| DEFAULT | PG_BUS | VSS4, VDD4 |

FIG. 3C

| PG_BUS SIGNALNAME | SIGNAL ATTRIBUTES |
|---|---|
| VSS | GROUND |
| VDD | POWER, 5v |
| CPVSS | GROUND |
| CPVDD | POWER, 12v |
| VSS2 | GROUND |
| VDD2 | POWER, 3.3v |
| VSSA | GROUND, ANALOG |
| VDDA | POWER, 5v, ANALOG |
| VSS3 | GROUND |
| VDD3 | POWER, 5v |
| VSS4 | GROUND |
| VDD4 | POWER, 5v |

| GROUP NAME | GROUP TYPE |
|---|---|
| G1 | HARD_GROUP |
| G2 | HARD_BLOCK |
| G3 | HARD_BLOCK |
| G4 | IO_CLUSTER |
| G5 | IO_CLUSTER |
| G6 | <UNTYPED> |
| DMA | <UNTYPED> |
| DEFAULT | <UNTYPED> |

Schematic Diagram of G4 Group
(with explicit pins)

METHOD AND APPARATUS FOR SPECIFYING MULTIPLE POWER DOMAINS IN ELECTRONIC CIRCUIT DESIGNS

BACKGROUND OF THE INVENTION

1. Field of the Invention

This invention relates to the field of electronic circuit design and in particular to an apparatus and method for specifying and testing a plurality of power and ground domains within an electronic circuit design.

2. Discussion of Related Art

There are several levels of electronic circuit design to design devices of varying sophistication. At a basic level, devices are modeled at the transistor level. Signals are described in terms of voltage levels, such as, 0 v, 3.36 v, 5 v. At the next design level, devices are modeled at the gate level. Here, transistor level devices are integrated, for example, as AND and OR boolean function logic gates. At this level, voltages are not explicitly described but rather logic levels of 0 or 1 or simulated. At the next higher design level, gate level devices are integrated to form integrated circuit (also referred to herein as IC). At this level, the most primitive or low-level component is the IC with a behavior description used for simulation. The highest design level is system design, where the components are boards or subsystems. Here the most primitive components are modeled using behavior descriptions.

Electronic circuit designers design and test the performance of electronic circuit designs using various tools. Computer Aided Design (CAD) tools (also commonly referred to as Computer Aided Engineering or CAE tools) are used to create, test, edit, and verify the performance of the electronic circuit design. CAD tools create a description of an electronic circuit design in the form of a design database having design information shared by the various tools in the CAD/CAE toolset. The tools of the CAD/CAE toolset include programs which allow a user to edit and review the electronic circuit design as described in the design database. The information in the design database can be presented to the user in graphical form, for example, a schematic wherein a graphical icon represents each device in the electronic circuit design. Interconnecting lines represents the interconnections between devices.

The information in the database can also be presented to the user in textual form in a list of the various interconnections between the devices in the electronic circuit design. This list is often referred to as a netlist, and can be represented as a tabular listing of the devices in the electronic circuit design. Each row (entry) of the table describes particular input and output signals of the device and the connection of those signal paths to other signal paths of other devices. The netlist includes a cell name for each device within the electronic circuit design. The cell name is typically the same name given to the equivalent device stored in a library database of devices available for use by the CAD/CAE tools. Other industry standard netlist formats include Verilog, EDIF, DEF and TDL. While these formats contain the same basic information as that of a tabular listing, these netlist formats are considered to be "languages" having well defined syntax and semantics which allow CAD tools to reliably exchange them for interaction among the tools.

Netlist or schematic views of an electronic circuit design are generally stored in or derived from the information stored in the design database. Thus, a tool which requires a netlist or schematic does so by extracting the required information from the design database and outputting the required list or graphical representation.

Table 1 below provides an example of a netlist for a simple exemplary electronic circuit design. As shown in FIG. 1A, a first AND Gate (U1) has inputs A and B and output D. A second AND Gate (U2) has an input D from the first AND Gate (U1), input C, and output E. As shown in Table 1, each individual AND Gate is separately identified by a cell name or type (usually equivalent to its library name in the design database of components used by the CAD/CAE tools) and by an instance identifier. The instance identifier is useful for distinctly identifying individual components within the circuit design. For example, the instance is useful for identifying the first AND Gate from the second AND Gate.

TABLE 1

| Name of Cell Instance | Cell Name/Type | Input Signals | Output Signals |
| --- | --- | --- | --- |
| U1 | AND Gate | A, B | D |
| U2 | AND Gate | C, D | E |

Table 1 and FIG. 1A, are examples of a trivial electronic circuit design. It is known in the art to integrate low-level or "primitive" designs to design devices of varying sophistication which obtain better performance, lower power consumption, etc. As the need increases for creating smaller and faster products, more components are being integrated into ICs. It is common to integrate pre-defined higher level circuit designs with other pre-defined high level electronic circuit designs to further increase the level of integration. Often such high level pre-defined circuits are referred to as "cells" or "standard cells." The process of designing an electronic circuit using such cells is often referred to as standard cell design. CAD/CAE tools which provide standard cell design capabilities generally include a library of standard cell designs which the user may select to create a new higher level electronic circuit design.

For example, it is now common that very complex standard cells are predefined in standard cell libraries, such as, cache memory which stores data within a computer, or a central processing unit (hereinafter referred to as the CPU). A final circuit design is comprised of the interconnection of such higher-level components, such as the cache memory, bus logic, CPU, etc.

Electronic circuit designs (e.g., standard cell circuit designs) which include various high level ICs, lower level ICs, and simple discrete devices may require multiple power and ground connections to a particular device for proper operation. Such multiple power and ground paths (also referred to as power domains) are useful for many purposes including: use of sophisticated power management schemes, isolation of sections of logic powered by battery-backup, electronic noise reduction, and simplification of testing.

The number of power and ground domains depends upon the particular problem the electronic circuit designer is solving. For example, an electronic circuit designer may want to isolate sections of a circuit from other power sources. Similarly, an electronic circuit designer may group the cells on the periphery of an IC (these cells provide the off-chip input/output signals and power and ground sources to the IC) that are associated with particular power sources and isolate these cells from other power and ground sources.

Electronic circuit designers creating entire circuit board designs that contain multiple ICs are also confronted with similar design requirements for multiple power and ground connections. In this case, the designer must provide a multiple number of power and ground domains to a group of devices, such as ICs, on the electronic circuit board. It is known to explicitly describe each of these signals in a board netlist and show the connectivity in the schematic. This method, however, is burdensome to the electronic circuit designer with the increasing number of components on boards and within the entire system.

As presently known in the art at the standard cell or IC design level, there are no explicit power and ground pins described or modeled for each cell. Instead, standard cells or ICs are assumed to be connected to a common power and ground for the entire design. Most netlist languages refer to this common power signal by a pre-defined name which represents a logical "1." Likewise the common ground signal is represented by a predefined signal name that represents a logical "0."

For the purpose of gate level or IC simulation, multiple power and ground signals serve no purpose. Since the standard cells are modeled assuming proper power and ground connection to every device, the power and ground signal pins are not in most modern standard cell libraries.

No one mechanism exists to automatically describe within the design database (e.g., in a netlist), multiple power domains from the transistor level to the board level. Presently, CAD/CAE tools do not provide a set of tools that easily allows identification of related groups of devices for association with multiple power and ground domains at the transistor, standard cell or IC level, and board levels. Consequently, these CAD/CAE tools cannot easily create, test, or simulate the design of a complex electronic circuit design with regard to multiple power and ground domains.

An informal solution to the above problems is presently practiced in the art and involves verbal communication of such multiple power and ground information among engineers outside the context of the CAD/CAE toolset features. For example, a layout engineer typically arranges the floorplan (the physical placement) of the electronic circuit design in a graphical floorplanning tool by selecting the location of the components and signal lines of the electronic circuit design using a schematic and/or netlist annotated with such verbal communication. The design engineer may communicate orally or in written annotations associated with the design as to preferred positioning as it may relate to preferred power and ground connections and groupings. Such manual communication techniques frequently introduce errors because information useful to the various CAD/CAE tools is manually transcribed and entered from the verbal communications. Since multiple power and ground connections are not currently stored within the netlist (the design database), annotations on the schematic may be implemented incorrectly because the layout engineer may incorrectly interpret the circuit designer's instructions or the instructions may be incomplete.

An alternative approach is to modify every cell in the standard cell library to make the power and ground pins explicit. In other words, the cell definition may force the design engineer to describe explicitly the connection of every power and ground signal associated with a particular cell or circuit which is included in the circuit design. Such a restriction adds significant costs due to updates required in the standard cell libraries and places an additional burden on the electronic circuit designer to explicitly connect every cell to a power and ground path in the netlist. Complex electronic circuit designs may contain hundreds of thousands of cells. The requirement to explicitly connect power and ground signals for each such cell can therefore represent a significant cost on every design. For example, as shown in FIG. 1B, cell U1 and U2 has two more additional pins (e.g., p and g) where the power pin "p" is connected to UDP and the ground pin "g" is connected to VSS.

It is evident from the above discussion that a need exists for an apparatus and method to define multiple power and ground domains within a circuit design to facilitate automatic checking and distribution of power and ground signals without imposing the severe overhead on the user of explicitly connecting every cell in the netlist to power and ground. Further, as noted above, it is preferable that such a method and apparatus be useful for specifying power and ground connections and many levels of electronic design from low level designs through board or system level designs.

SUMMARY OF THE INVENTION

The present invention solves the above and other problems, thereby advancing the useful arts, by providing an apparatus and method for implicitly specifying multiple power and ground domains within an electronic circuit design. The present invention provides for integrating information regarding multiple power domains into the CAD/CAE design database storing information regarding the electronic circuit design. Integrating power and ground information into the CAD/CAE design database provides the CAD/CAE tools the information to design, test, simulate, etc. multiple power and ground domains within an electronic circuit design.

In particular, data structures defining groups of circuits (e.g., cells or devices) in the electronic circuit design are added to the design database. Additional data structures define the physical proximity of the devices within a group and define the power and ground connections in the circuit design. Attributes are associated with the power and ground connections in the design database. The present invention thereby associates each group of devices in the circuit design with an appropriate power and ground connection in accordance with the attributes. Thus, the present invention allows the user and CAD/CAE tools to assign groups of devices to the power and ground domains having matching attributes.

The present invention provides the CAD/CAE tools all of the information required to test multiple power and ground domains within an electronic circuit design because CAD/CAE tools have the information required to match defined groups of devices to defined power and ground domains. This is attained through the integration of information within the data structures with other information regarding the circuit design within the design database.

In accordance with the present invention, circuit designers can use the CAD/CAE tools to automatically test an electronic circuit with multiple power and ground domains without the need to explicitly connect every cell in the circuit design to a power and ground source. The present invention therefore automates the process of associating cells (and other devices) with particular power and ground connections. Automating the process helps reduce the likelihood of misunderstanding inherent in manual procedures as presently practiced in the art.

It is therefore an object of the present invention to provide apparatus and methods for defining multiple power and ground domains within an electronic circuit design.

It is an another object of the present invention to provide apparatus and methods for defining one or more groups of devices within an electronic circuit design and associating power and ground connections with the defined groups of devices.

It is yet another object of the present invention to provide apparatus and methods for defining multiple power and ground domains within an electronic circuit design without requiring a designer to explicitly connect every device to power and ground.

The above and other objects, aspects, features, and advantages of the present invention will become apparent from the following description and the attached drawings.

BRIEF DESCRIPTION OF THE DRAWINGS

FIG. 3 is a flow chart of the preferred embodiment of the present invention showing the method for defining multiple power and ground domains.

FIG. 3A–D are diagrams of the data structures operable within the present invention.

FIG. 4 is a logic diagram of an INPAD cell.

DETAILED DESCRIPTION OF THE PREFERRED EMBODIMENTS

Figure 1A:
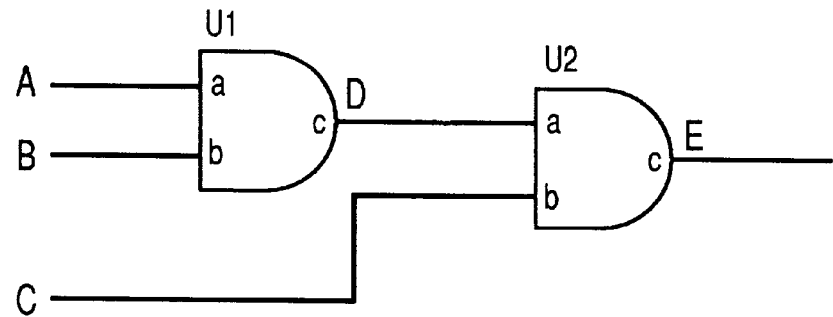
FIG. 1A is a logic diagram associated with the netlist in Table 1.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

The specific embodiment described is directed towards gate level design. A person skilled in the art, however, will recognize that this illustrative embodiment as described is also operable to define multiple power and ground domains implicitly at the transistor or board (e.g., systems) level.

A power and ground connection to a device, such as a cell, can either be implicit or explicit. An implicit power and ground connection (e.g., power source) is a power and ground connection not defined in the netlist. Whereas an explicit power and ground pin is a power and ground pin that is defined in the netlist. For example, in Table 1, a power and ground connection has not been defined for either AND Gate U1 or AND Gate U2. The present invention allows the electronic circuit designer to implicitly define the power and ground connection of AND Gate U1 or U2. Thus allowing the circuit designer to define a plurality of power and ground connections required for the particular purpose of the IC.

Figure 2A:
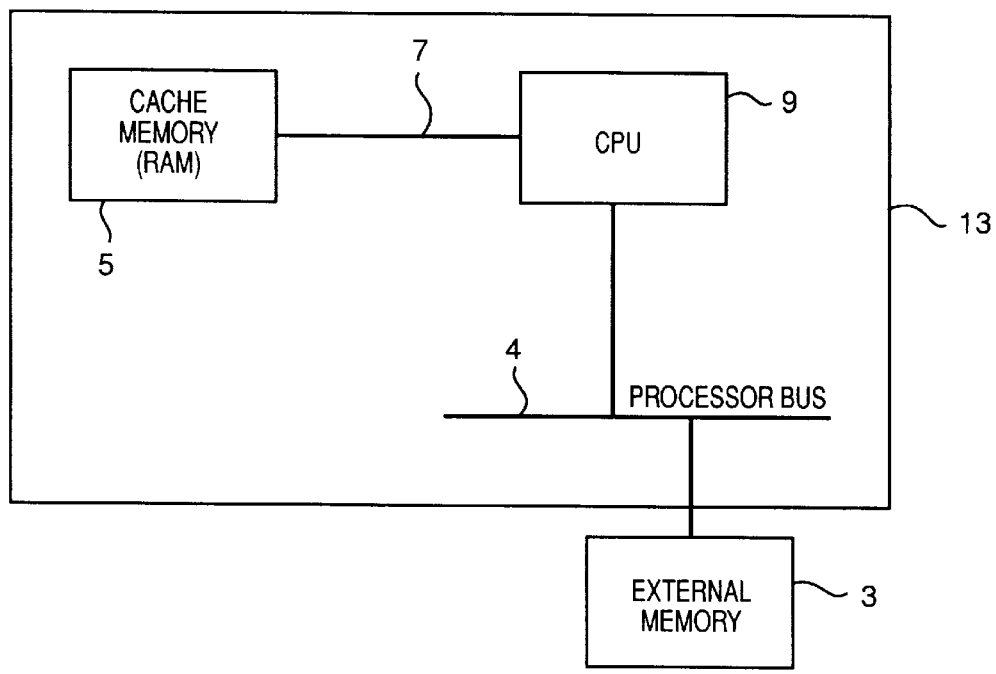
FIG. 2A is a block diagram of an IC.

FIG. 2A depicts a block diagram of an exemplary IC 13. Cache memory 5 is attached to a central processing unit 9 (hereinafter referred to as "CPU") via interconnection 7. Cache memory 5 is smaller than main memory, such as external memory 3 (e.g., disk drives or other permanent storage device). CPU 9 temporarily stores data in cache memory 5 that is frequently accessed and may later store the data permanently in the external memory 3 via processor bus 4.

Cache memory 5 may be constructed of Random Access Memory devices (hereinafter referred to as "RAM"). RAM devices do not permanently store information. Instead, once the power source is turned off or a power failure occurs, a RAM device loses any information stored within its memory. To make the RAM memory non-volatile, it is known to connect a battery to a RAM device. This makes the information stored in the battery-backed RAM device non-volatile. An IC that incorporates the battery-backed RAM device requires two power domains one domain for its regular power D.C. source and another power domain for the battery.

Figure 2B:
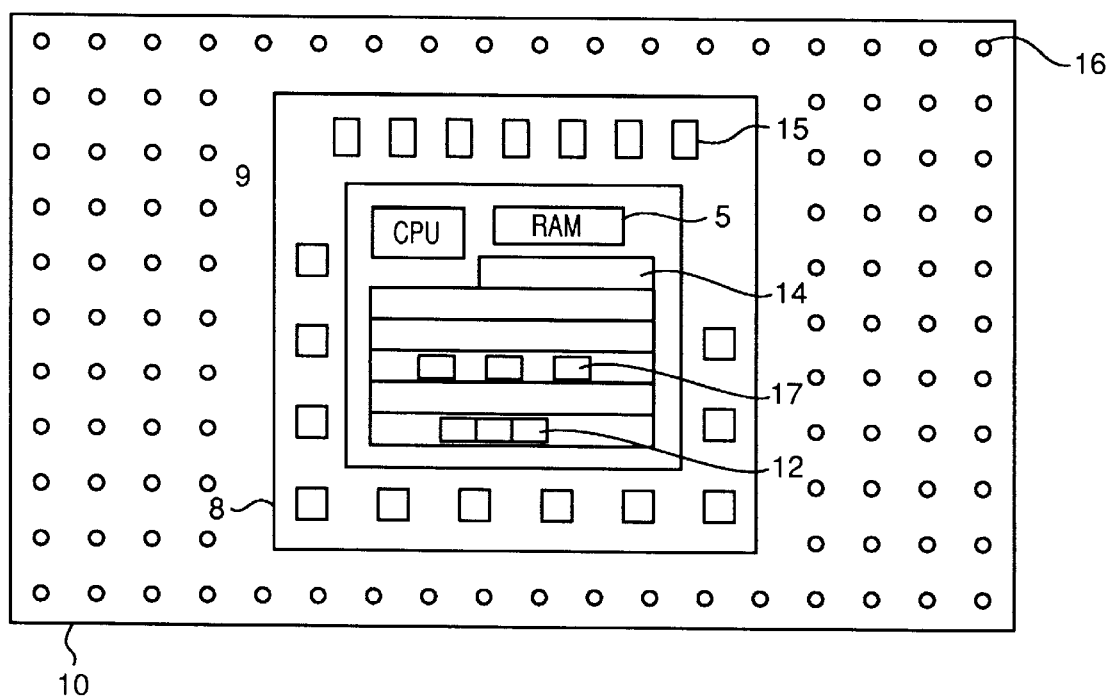
FIG. 2B is an underside view of a typical IC.

FIG. 2B depicts the bottom of a typical integrated circuit 10. An integrated circuit 10 includes a chip or die 8 which is an implementation of the design as shown in FIG. 2A. The integrated circuit 10 uses package pins 16 for connecting off chip input/output signals and power and ground signals to the integrated circuit. Bonding wires (not shown) electrically connect the package pins 16 to the I/O cells 15 on the chip. These I/O cells 15 are on the periphery of the chip 8. Also shown in FIG. 2B is the standard cell rows 14, a standard cell 17, and a hard group 12 which are later described.

FIG. 3 is a flow chart of the preferred embodiment of the present invention showing the method which defines multiple power and ground domains within a circuit design. In accordance with the present invention, a CAD/CAE tool receives the netlist(s) as input 20. This netlist(s) can be user defined, or can be generated by the CAD/CAE tools from a schematic or synthesized from a high-level description language such as HDL. After reading cell interconnection information from the netlist, the database library searches for information regarding the cells defined in the netlist. The CAD/CAE tool now has database information regarding the cells comprising the circuit design. Additionally, information regarding the power and ground connections, that is, power sources within the circuit design is retrieved from the design database. For the circuit design as shown in FIG. 2A, the CAD/CAE tool would retrieve from the design database, for example, the names and instance of the cells (e.g., cache memory 5, CPU 9) and the information regarding the interconnections (e.g., via path 7) between the cells.

In accordance with the present invention, the electronic circuit designer defines multiple power and ground domains by defining one or more devices, such as, cells that pertain to a group 30 or defines a plurality of groups of devices (e.g., cells). For example, cache memory 5 has a first power and ground domain for the D.C. power source while the circuit is in its nominal state and a second power and ground domain for the battery when the circuit is not powered on. In the present example, the circuit designer defines the cells within cache memory 5 as a group, which require two power and ground connections. The electronic circuit designer can use the Group statement (eq. 1) or optionally the Group_Type statement (eq. 2) to define these groups of cells.

The present invention provides various ways to partition cells into a group or groups of cells. In a first method, a group of cells are identified as a group because the contents of this group can be characterized by constraints on the physical proximity of cells within the physical design of the IC. Thus, cells within an electronic circuit design may be subdivided into groups with pre-defined categories describing the constraints on the physical proximity of core cells or I/O cells within the integrated circuit.

Core cells 12, 14, 17 typically are located within the center of the integrated circuit chip 8. Core cells 17 may reside within a row 14 or group 12 and share power and ground connections. Group of cells that map to a region in the layout, for example, groups of type Partition, may have one power and ground connection associated with this group of cells. In contrast, I/O cells 15 are around the periphery of the integrated circuit 8 and have one or more power and ground domains because these cells distribute power and ground signals to the core cells within the chip 8.

With regard to I/O cells 15, one or more I/O cells 15 may be required to provide separate power and ground signals to the core cells within the device. For example, if separate power and ground signals are required to make cache memory 5 (FIG. 2A), nonvolatile, the circuit designer will identify one or more I/O cells 15 to provide both power and ground sources to the cache memory 5.

If the cell within the design is not associated with a group, then the cells are associated with the default group as defined by the circuit designer. The default group allows the electronic circuit designer to assign a particular power and ground domain to cells which the electronic circuit designer does not want to associate with any particular group of cells. The default group is typically user-defined. Specifically, the default group of cells is electrically tied together such that all of the cells belonging to the default group share a particular power and ground connection.

Table 2 is a listing of these currently defined group types.

TABLE 2

| GROUP TYPE | FUNCTION |
| --- | --- |
| HARD_GROUP | Specifies that the cells within this group reside side-by-side in a row. Thus, the electronic circuit designer does not want the relative placement of these cells to change. |
| HARD_CELL | Specifies that the interconnections between the cells within this group are pre-routed and therefore cannot be altered. The hard cell must fit within a row. |
| HARD_BLOCK | Specifies that the interconnections between the cells within this group are pre-routed and therefore cannot be altered. Unlike hard cells, hard blocks are not restricted to fit within a row. |
| I/O_HARD_CELL | Specifies the cells around the periphery of the integrated circuit. For example FIG. 2B, shows I/O cells 15 and the metal pins 16 which bring off chip input/output signals or power and ground to the chip 8. |
| PARTITION | Specifies to the layout engineer that the cells must be placed closely together. |
| ANALOG_BLOCK | Similar as the previously mentioned block type, but in this case, the cells are elements of an analog circuit. |
| I/O CLUSTER | Refers to a group of I/O cells that requires all pads within this group to receive the same power and ground signals. |

The electronic circuit designer may alternatively define cells as a group although there is no physical constraint that the user wishes to associate with the cells. These are user-defined groups identifying cells associated with this particular group without a particular defined group type. As in the case when a circuit designer may want to isolate the power source in an analog section from the power source in the digital section of a circuit design. Similarly, in the case of cache memory 5, the cells within the cache memory 5 are defined as a group due to the two required power and ground connections used by the cache memory 5.

After defining a plurality of groups of cells, the next step is to define power and ground group attributes 40. Group attributes include the following items: user-defined and pre-defined attributes, a feature common to the plurality of devices defined as a group, power and ground connections, information regarding power and ground connections, categories regarding the physical proximity of the devices (e.g., Table 2), or other types of information required to define one or more power and ground domains.

A group attribute identifying the physical proximity of the plurality of cells identifies whether the plurality of cells are indicative of I/O cells 15 or core cells 12, 14, 17. In the preferred embodiment, the pre-identified power and ground attributes are the currently defined categories within Table 2.

A plurality of cells may be defined as a group although one or more power and ground attributes are associated with a portion of a plurality of cells within the group. For example, the electronic circuit designer may identify power and ground domains to implement power management schemes that are not operable at all times. As in the case of cache memory 5 having nominal D.C. power while the circuit is in use and a battery source to maintain power to a portion of cache memory 5 when the circuit is powered off.

Similarly, in the case of laptop computers, consumers are demanding lightweight laptop computers. One way to reduce the weight of a computer has been by using a smaller and lighter battery in addition to power management schemes that manage and conserve the power from the battery when the battery is powering the laptop computer. These power management schemes conserve energy, for example, by not providing electricity to unused devices when the battery is providing power to the laptop.

FIG. 3A is an example of the data structure 100 utilized within the present invention to store the identified groups of cells. This data structure can be stored along with the electronic circuit design information resident in the design database used by the CAD/CAE tools or can reside in another memory location that is accessible to the CAD/CAE tools.

In the preferred embodiment, the electronic circuit designer enters information within data structure 100 identifying a group or groups of cells with the following command statement, such as, $$\text{GROUP } \{\{<\text{tag}><\text{cell name}>+\}|<\text{cell type}>\}. \tag{eq. 1}$$

where "+" indicates more than one item can be listed and "|" indicates that either {<tag><cell name>+} or <cell type> is required.

This statement defines a tag, such as, the group name 110 and a list of cell instances belonging to the group 120. The statement can also use the library cell name to refer to a group to identify all instances of a particular cell type as one group of cells. For example, a group may include all instances of a particular cell, such as, DMA 130 (FIG. 3A).

Data structure 100 has entries identifying each group of cells entered via command GROUP. Each group includes at least one cell from the circuit design. As shown in FIG. 3A, Group G1 includes the first instance of AND Gate U1 and the second instance of AND Gate U2. Group G2 includes the first instance of cache memory U3 and Group G6 includes the second instance of cache memory U14. An example of a group defined to include all instances of a particular cell type is Group DMA 130, which includes all instances of DMA cells 140. Finally any cells which were not listed as part of any other group via group statements are associated automatically with the default group, for example, U18, U19, and U20. In the preferred embodiment, groups can be identified by the electronic circuit designer or by the CAD/CAE tools.

Returning to FIG. 3, once the group or groups of cells are defined 30, the power and ground signal attributes are defined 40 and the defined group or groups of cells are associated with power and ground connections in accordance with the power and ground attributes to define a power and ground domain 50. The associated information provides the layout engineer with enough information to assign pins 16 for the multiple power and ground domains. Further, the associated information provides the CAD tools the required information to verify the groups defined in the specification are consistent with the definition of the cells in the initial netlist.

FIG. 3B is an example of the data structure 200 utilized within the present invention to store a plurality of entries identifying power and ground attributes associated with each group. As in the case of data structure 100, data structure 200 can be stored along with the electronic circuit design information resident in the design database used by the CAD/CAE tools or can reside in another memory location that is accessible to the CAD/CAE tools.

The following statement defines attributes to be associated with a group of cells:

GROUP_ATTRIB<group_name><group attribute>+ (eq. 2)

where <group name> is <tag> or <cell type> or "Default" and <group attribute>+ is one or more power and ground attributes such as those listed in data structure 200.

Group attributes may be either user defined, such as, USER 1 216, or a predefined attribute, such as, PG_Bus 220. As shown in FIG. 3B, group name 201, G1 210, is associated with attribute named 202, PG_Bus 220, which includes values 203 VSS and VDD 230. Likewise, G1 215 is associated with a user defined attribute User 1 216 which defines the power and ground signals within G1 as digital 217.

Information regarding the power and ground connections within the design database is stored in a data structure 300 such as shown in FIG. 3C. This data structure can be stored along with the electronic circuit design information resident in the design database used by the CAD/CAE tools or can reside in another memory location that is accessible to the CAD/CAE tools.

Information within this data structure includes the power and ground connections within the circuit design, specification details of the power and ground connections, etc. For example, as shown in FIG. 3C, predefined attribute PG_Bus 310 has a signal defined VSS 312 as a ground. The following statement can be used to define specific information regarding the character of a particular power or ground connection within data structure 300 as shown in FIG. 3C.

SIGNAL_ATTRIB<power or ground connection><power or ground attribute>+ (eq. 3)

where "+" indicates more than one item can be listed.

In some cases, the user may wish to associate physical proximity characteristics (e.g., constraints) for a group of cells. The GROUP_TYPE statement is utilized to define these characteristics.

GROUP TYPE {<group name>}{HARD_GROUP|HARD_CELL|HARD_BLOCK|IO_HARD_CELL|PARTITION|ANALOG_BLOCK|IO_CLUSTER} (eq. 4)

where <group name> is <tag> or <cell type> or "Default" and "|" indicates either HARD_GROUP or HARD_CELL or HARD_BLOCK or IO_HARD_CELL or PARTITION or ANALOG_BLOCK or IO_CLUSTER is allowed.

Figures 3D, 4:
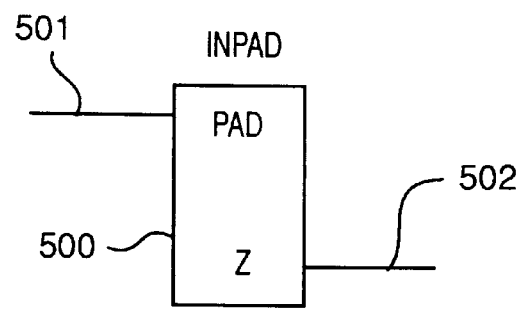

The information defined by GROUP_TYPE statements may be stored in the data structure 400 as shown in FIG. 3D.

As shown in FIG. 3D, group G1 401 is defined as of group type 406 HARD_GROUP 402. Likewise, group 405 DMA 403 is not defined 404 under these predefined group types 406.

Data structure 400 can be stored along with the electronic circuit design information resident in the design database used by the CAD/CAE tools or can reside in another memory location that is accessible to the CAD/CAE tools.

One skilled in the art will recognize that other data structures can be used to store and manipulate the required information, such as, lists, tables, etc. The information can be stored within one large data structure or the information can be stored within multiple data structures. Additionally, one skilled in the art will recognize that other command structures can be used to enter the required information into the data structures.

While describing exemplary data structures for storing and defining multiple power and ground domains and exemplary command statements for reading the data into the data structures, the following is a discussion regarding layout verification of the power and ground connections and pins for core cells and I/O cells. Information regarding power and ground connections is retrieved to verify the I/O cell and core cell layout regarding explicitly defined power and ground connections. Additionally, it is determined whether the layout of the I/O or core cell implicit power and ground connections conflict with other explicitly defined power and ground connections. Specifically, off-chip power and ground signals must be traced to the I/O and core cell's implicit power and ground pins. For example, verification is required that an I/O cell is connecting the off chip power and ground connection to the appropriate I/O cell(s) and to the appropriate core cell(s).

As previously stated, power and ground cell pins are implicitly defined and cell input and output data signal pins are explicitly defined. Power and ground connections are associated with the implicit power and ground pins of cells in the group of cells, in the order that they are listed in the GROUP_ATTRIBUTE command. Thus, the first power and ground connection listed under values 203 in data structure 200 (FIG. 3B) is associated with the first implicit power and ground pin.

Figure 1B:
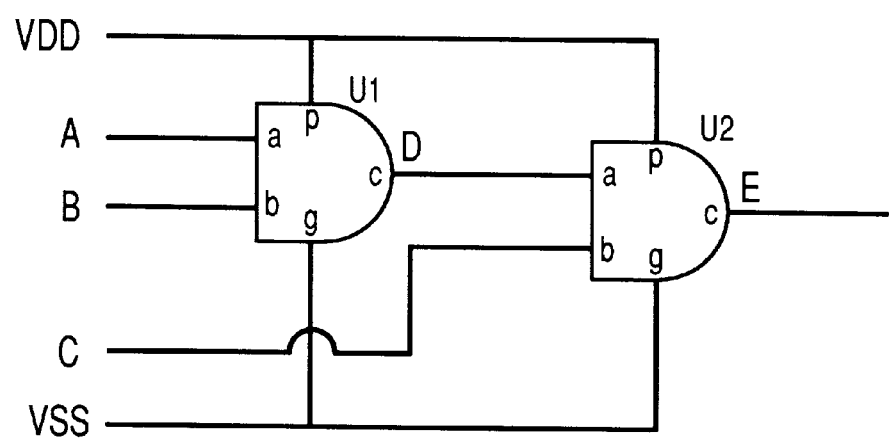
FIG. 1B is a logic diagram with explicit power and ground connections.

For core cells, implicit power and ground pins are defined after the explicit input and output data pins have been defined in the design database. If there are N defined power and ground connections within an associated entry in data structure 200, each of the N power and ground connections are assigned to an implicit power and ground pin in the order listed. For example, for the group of cells identified from the netlist in Table 1 and FIG. 1A, the design database would have three explicit input signal pins and one explicit output signal pin. Thus within the design database, pin numbers are defined for each of the cells identified in the schematic diagram in FIG. 1A. Pin #1 is cell input pin a for U1. Pin #2 is cell input pin b for U1. Pin #3 is cell output pin c for U1. As shown in FIG. 1B, there are two additional implicit pins in U1, which are "p" and "g." Pin #4 is power pin "p" and pin #5 is ground pin "g."

With regard to I/O cells, generally there are more than two implicit pins for I/O cells. These cells distribute power and ground signals to the core cells within the chip and additional I/O cells may be required to separate power and ground connections to the core cells within the IC.

Figure 5:
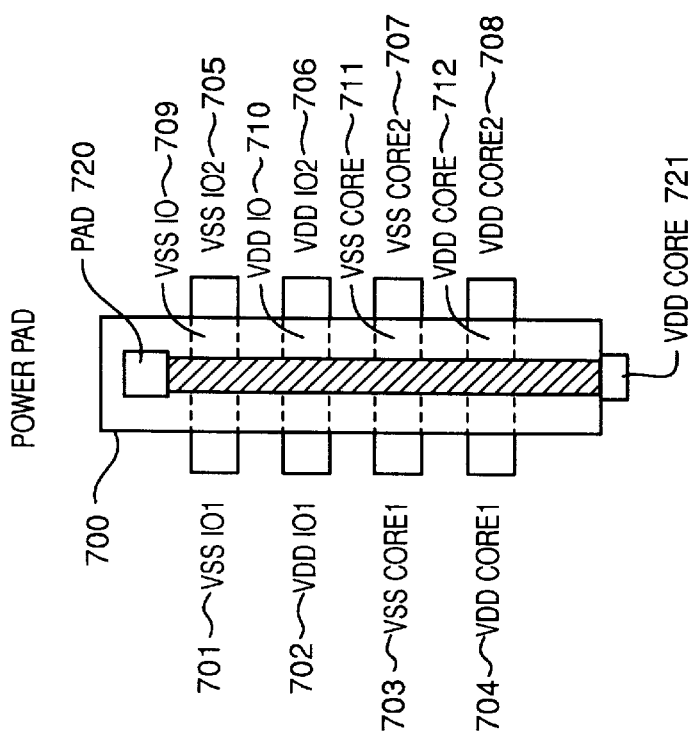
FIG. 5 is a physical representation of an INPAD cell.
Figure 5:
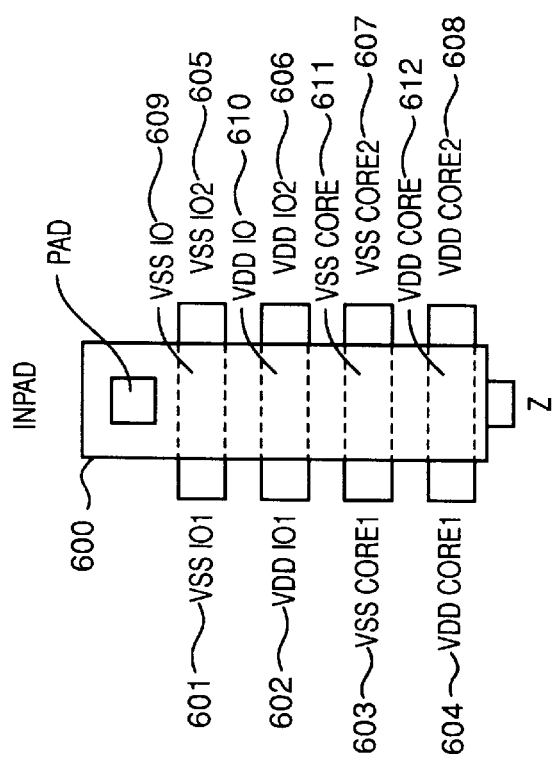

FIG. 4 is a schematic/logic diagram of an I/O cell, INPAD 500. As shown in FIG. 4, this cell has two explicit pins, Pad 501 and Z 502. PAD 501 is the I/O cell input pin, which is bonded to the package pin via a bond wire and provides the electrical connection from the circuit board to the I/O cell. Z 502 is the I/O cell output pin, which provides the electrical connection from the I/O cell to other cells within the IC. There are various other types of cells such as output I/O cells, OUTPAD, and power I/O cells, POWER_PAD. FIG. 5 shows a physical view of an INPAD 600 and an example of the POWER_PAD 700.

As shown in FIG. 5, INPAD 600 has eight implicit metal ports to connect the following power and ground signals to other I/O cells within the IC. These eight metal ports are VSSIO1 601 connected to VSSIO2 605, VDDIO1 602 connected to VDDIO2 606, VSSCORE1 603 connected to VSSCORE2 607, and VDDCORE1 604 connected to VDDCORE2 608. Each of these metal ports are not explicitly defined within a netlist. These metal ports are electrically connected to VSSIO 609, VDDIO 610, VSSCORE 611, and VDDCORE 612 respectively to provide VDD power and VSS ground connectivity to other I/O cells.

Similarly as shown in FIG. 5, POWER_PAD 700 has input pin PAD 720 and output pin VDDCORE 721. POWER_PAD 700 has eight metal ports to connect the following power and ground signals to other I/O or core cells within the IC. These eight metal ports are VSSIO1 701 connected to VSSIO2 705, VDDIO1 702 connected to VDDIO2 706, VSSCORE1 703 connected to VSSCORE2 707, VDDCORE1 704 connected to VDDCORE2 708. Each of these metal ports are not explicitly defined within a netlist. These metal ports are electrically connected to VSSIO 709, VDDIO 710, VSSCORE 711 and VDDCORE 712 respectively to provide VDD power and VSS ground connectivity to other I/O or core cells.

If I/O cells are grouped using the I/O_CLUSTER group type, it is verified that I/O cells within I/O_CLUSTER are electrically connected together. Information from each I/O cell within the cluster regarding the implicit power and ground pins and the associated power and ground connections are assembled into a port/pin mapping to verify the I/O cells within an I/O cluster are electrically connected together. A port/pin mapping, as shown in Table 3, is a mapping between the cell pins (e.g., implicit and/or explicit) and the cells physical metal ports. Table 3 is an example of the port/pin mapping description stored for an input pad INPAD as shown in FIG. 5.

TABLE 3

| Metal Port Name | Electrical Pin Name | Cell Pin Number |
| --- | --- | --- |
| Pad | Pad | explicit pin #1 |
| Z | Z | explicit pin #2 |
| VSSI01 | VSSI0 | implicit pin #3 |
| VSS102 | VSSI0 | implicit pin #3 |
| VSSI01 | VDDI0 | implicit pin #4 |
| VSSI02 | VDDI0 | implicit pin #4 |
| VSSCORE1 | VSSCORE | implicit pin #5 |
| VSSCORE2 | VSSCORE | implicit pin #5 |
| VDDCORE1 | VDDCORE | implicit pin #6 |
| VDDCORE2 | VDDCORE | implicit pin #6 |

Figure 6:
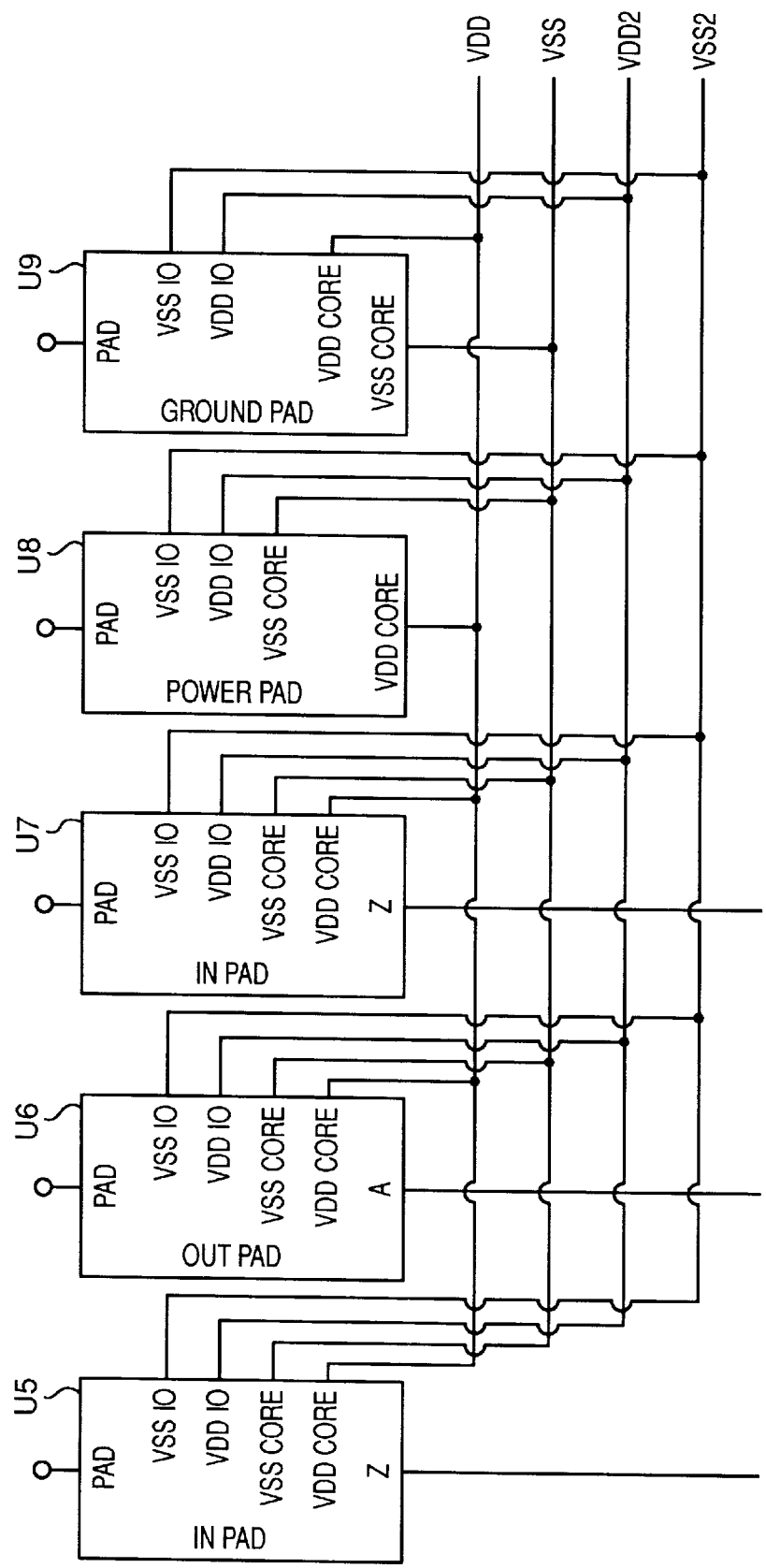
FIG. 6 is a schematic diagram of I/O cells with all pins explicitly shown.

FIG. 6 shows a schematic diagram of an I/O_CLUSTER with all pins explicitly shown. As previously defined in data structure 120, U5 is an INPAD, U6 is an OUTPAD, U7 is an INPAD, U8 is a power Pad, and U9 is a ground pad. All of the implicit pins are connected to the power and ground signals, as defined by the PG_BUS group attribute statement. The following are exemplary statements to define these I/O cells and cluster:

GROUP G4 U5, U6, U7, U8, U9;
GROUP_TYPE G4 IO_CLUSTER;
GROUP_ATTRIB G4 (PG_BUS VSS, VDD, VSS2, VDD2);
SIGNAL_ATTRIB VSS (GROUND);
SIGNAL_ATTRIB VDD (POWER, 5 V);
SIGNAL_ATTRIB VSS2 (GROUND);
SIGNAL_ATTRIB VDD2 (POWER, 12 V);

As described, the present invention is operable in conjunction with CAD/CAE tools to test multiple power and ground domains and determine that the multiple power and ground domains are properly specified within the layout of the floorplan. The present invention reduces the likelihood of misunderstanding between the electronic circuit designer and the layout engineer regarding the location of multiple power and ground domains within the circuit design without the need to explicitly connect every cell named in the netlist to a power and ground source.

While the invention has been illustrated and described in detail in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. A computer operable method for managing multiple power and ground connections within an electronic circuit design, said method comprising the steps of:

defining within a design database a plurality of groups, each group comprising at least one device from said circuit design;

defining within a desian database a plurality of power and ground attributes wherein a portion of said plurality of power and ground attributes are associated with said plurality of groups in said circuit design and a portion of said plurality of power and ground attributes are associated with said power and ground connections in said circuit design; and establishing connectivity between said plurality of groups and said multiple power and ground connection by associating at least one power and ground connection of said multiple power and ground connections with at least one group of said plurality of groups in accordance with said power and ground attributes within said design database;.

2. The method of claim 1 wherein the step of defining a plurality of groups includes the step of:

receiving user input identifying devices associated with each said group.

3. The method of claim 1 wherein the step of defining a plurality of groups includes the steps of:

identifying at least one power and ground attribute associated with a portion of a plurality of devices in said circuit design; and defining a group comprising said plurality of devices.

4. The method of claim 3 wherein said at least one power and ground attribute identifies at least one of said plurality of power and ground connections.

5. The method of claim 3 wherein said at least one power and ground attribute is common to each of said plurality of devices comprising said group.

6. The method of claim 3 wherein said at least one power and ground attribute identifies the physical proximity characteristic of said plurality of devices comprising said group.

7. The method of claim 6 wherein said at least one power and ground attribute identifies said physical proximity characteristic of said plurality of devices for at least one core Cell.

8. The method of claim 6 wherein said at least one power and ground attribute identifies said physical proximity characteristic of said plurality of devices for at least one I/O Cell.

9. The method of claim 1 wherein at least one of said plurality of power and ground attributes identifies the physical proximity characteristic of devices in at least one of said plurality of groups.

10. The method of claim 1 wherein at least one of said plurality of power and ground attributes identifies at least one of said plurality of power and ground connections.

11. The method of claim 1 wherein at least one of said plurality of power and ground attributes include at least one user-defined power and ground attribute.

12. The method of claim 1 wherein said plurality of power and ground attributes include user defined attributes and wherein the step of establishing connections by associating includes the step of:

associating at least one power and ground connection of said plurality of power and ground connections with at least one group of devices of said plurality of groups of devices in accordance with said user defined attributes.

13. The method of claim 1 wherein said electronic circuit design comprises an integrated circuit.

14. A program storage device readable by a machine, tangibly embodying a program of instructions executable by the machine to perform method steps, for managing multiple power and ground connections within an electronic integrated circuit design, said method including the steps of:

defining within a design database a plurality of groups, each group comprising at least one device from said circuit design;

defining within a design database a plurality of power and ground attributes wherein a portion of said plurality of power and ground attributes are associated with said plurality of groups in said circuit design and a portion of said plurality of power and ground attributes are associated with said power and ground connections in said circuit design; and establishing connectivity between said plurality of groups and said multiple power and ground connection by associating at least one power and ground connection of said multiple power and ground connections with at least one group of said plurality of groups in accordance with said power and ground attributes within said design database;.

15. The program storage device of claim 14 wherein the step of defining a plurality of groups includes the steps of:

identifying at least one power and ground attribute associated with a portion of a plurality of devices in said circuit design; and defining a group comprising said plurality of devices.

16. The program storage device of claim 14 wherein at least one of said plurality of power and ground attributes identifies the physical proximity characteristic of devices in at least one of said plurality of groups.

17. The program storage device of claim 14 wherein at least one of said plurality of power and ground attributes identifies at least one of said plurality of power and ground connections.

18. An apparatus operable within computer aided electronic design tools, for managing multiple power and ground connections within an electronic integrated circuit design, said apparatus including:

means for defining a plurality of groups in a desian database, each group including at least one cell from said integrated circuit design;

means for defining a plurality of power and ground attributes in a design database wherein a portion of said plurality of power and ground attributes are associated with said plurality of groups in said integrated circuit design and a portion of said plurality of power and ground attributes are associated with said power and ground connections in said circuit design; and means for establishing connectivity between said plurality of aroups and said multiple power and ground connections by associating at least one power and ground connection of said multiple power and ground connections with at least one group of said plurality of groups in accordance with said power and ground attributes within said design database.

19. The apparatus of claim 18 wherein the means for defining a plurality of groups includes:

means for identifying at least one power and ground attribute associated with a portion of a plurality of devices in said circuit design; and means for defining a group comprising said plurality of devices.

20. The apparatus of claim 18 wherein at least one of said plurality of power and ground attributes identifies the physical proximity characteristic of devices in at least one of said plurality of groups.

21. The apparatus of claim 18 wherein at least one of said plurality of power and ground attributes identifies at least one of said plurality of power and ground connections.

22. A method for establishing connectivity between cells in a circuit and multiple power and ground connections comprising the steps of:

defining a plurality of group attributes in a design database;

defining multiple power and ground connections in said design database;

associating in said design database a portion of said plurality of group attributes with each of said multiple power and ground connections;

associating in said design database a portion of said plurality of group attributes with each of said cells in said circuit; and establishing connectivity between said cells of said circuit and said multiple power and ground connections by matching said group attributes associated with said multiple power and ground connections with said group attributes associated with said cells.

23. The method of claim 22 wherein at least one attribute of said plurality of group attributes identifies the physical proximity characteristic of said cells.

24. The method of claim 23 wherein said at least one attribute identifies said physical proximity characteristic for at least one Core Cell of said plurality of cells.

25. The method of claim 23 wherein said at least one attribute identifies said physical proximity characteristic for at least one I/O Cell of said plurality of cells.

* * * * *

UNITED STATES PATENT AND TRADEMARK OFFICE
CERTIFICATE OF CORRECTION

PATENT NO.         : 6,083,271
APPLICATION NO.    : 09/072566
DATED              : July 4, 2000
INVENTOR(S)        : Morgan Page 1 of 1

It is certified that error appears in the above-identified patent and that said Letters Patent is hereby corrected as shown below:

Col. 12, in claim 1, line 7, replace "desian" with "design".

Col. 12, in claim 1, line 20, remove the extraneous ";".

Col. 14, in claim 18, line 16, replace "aroups" with "groups".

Signed and Sealed this
Tenth Day of May, 2011

David J. Kappos
*Director of the United States Patent and Trademark Office*